United States Patent
Bolourchi et al.

(10) Patent No.: US 8,051,360 B2
(45) Date of Patent: *Nov. 1, 2011

(54) METHOD AND APPARATUS FOR PROCESSING A DOWNLINK SHARED CHANNEL

(75) Inventors: Nader Bolourchi, Larchmont, NY (US); Stephen E. Terry, Northport, NY (US); Stephen G. Dick, Nesconset, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/862,561

(22) Filed: Aug. 24, 2010

(65) Prior Publication Data

US 2010/0318886 A1 Dec. 16, 2010

Related U.S. Application Data

(63) Continuation of application No. 11/129,850, filed on May 16, 2005, now Pat. No. 7,783,953, which is a continuation of application No. 10/035,771, filed on Dec. 26, 2001, now Pat. No. 6,915,473.

(60) Provisional application No. 60/290,740, filed on May 14, 2001, provisional application No. 60/314,993, filed on Aug. 24, 2001, provisional application No. 60/345,358, filed on Oct. 25, 2001.

(51) Int. Cl.
*H03M 13/00* (2006.01)

(52) U.S. Cl. ............... 714/758; 714/762; 714/755

(58) Field of Classification Search .............. 714/758, 714/755, 762, 756, 751, 39; 370/332, 312
See application file for complete search history.

(56) References Cited

U.S. PATENT DOCUMENTS

| | | | |
|---|---|---|---|
| 4,910,736 A | 3/1990 | Tanaka et al. |
| 5,142,539 A | 8/1992 | Dahlin et al. |
| 5,301,247 A | 4/1994 | Rasmussen et al. |
| 5,355,412 A | 10/1994 | Kangas |
| 5,357,525 A | 10/1994 | Moriue et al. |
| 5,390,197 A | 2/1995 | MacDonald et al. |
| 5,404,355 A | 4/1995 | Raith |
| 5,659,569 A | 8/1997 | Padovani et al. |
| 5,689,518 A | 11/1997 | Galand et al. |

(Continued)

FOREIGN PATENT DOCUMENTS

CA 2374815 12/2000

(Continued)

OTHER PUBLICATIONS

"DL Control Channel Structures for Parameters Sent Simultaneously With HS-DSCH TTI." TSG-RAN WG1/WG2 Adhoc on HSDPA, Sophia Antipolis, France, (Apr. 5-6, 2001).

(Continued)

*Primary Examiner* — Fritz Alphonse
(74) *Attorney, Agent, or Firm* — Volpe and Koenig, P.C.

(57) ABSTRACT

A method and apparatus for receiving a wireless signal of a control channel wherein the wireless signal includes control information and an N bit field. The N bit field includes an N bit cyclic redundancy check (CRC) and an N bit user equipment (UE) identity wherein the value of N is a positive integer. The UE identity may be any one of a plurality of UE identities associated with the UE.

20 Claims, 4 Drawing Sheets

U.S. PATENT DOCUMENTS

| | | | |
|---|---|---|---|
| 5,722,077 A | 2/1998 | Kanai | |
| 5,845,212 A | 12/1998 | Tanaka | |
| 5,917,810 A | 6/1999 | De Bot | |
| 5,917,840 A | 6/1999 | Cheney et al. | |
| 5,930,706 A | 7/1999 | Raith | |
| 6,005,871 A | 12/1999 | Petersen et al. | |
| 6,134,597 A | 10/2000 | Rieth et al. | |
| 6,172,971 B1 | 1/2001 | Kim | |
| 6,201,811 B1 | 3/2001 | Larsson et al. | |
| 6,240,304 B1 | 5/2001 | Blankenstein et al. | |
| 6,424,632 B1 | 7/2002 | Poret et al. | |
| 6,430,163 B1 | 8/2002 | Mustajarvi | |
| 6,735,185 B1 | 5/2004 | Noneman | |
| 6,850,509 B2 | 2/2005 | Lee et al. | |
| 6,859,445 B1 | 2/2005 | Moon et al. | |
| 6,882,727 B1 | 4/2005 | Vialen et al. | |
| 6,901,104 B1 | 5/2005 | Du et al. | |
| 6,928,066 B1 | 8/2005 | Moon et al. | |
| 7,054,633 B2 | 5/2006 | Seo et al. | |
| 7,079,848 B2 | 7/2006 | Das et al. | |
| 7,181,298 B1 | 2/2007 | Yoshio et al. | |
| 7,184,447 B1 | 2/2007 | Koo et al. | |
| 7,184,743 B2 | 2/2007 | Walton et al. | |
| 7,200,788 B2 | 4/2007 | Hiraki et al. | |
| 7,366,105 B2 | 4/2008 | Yi et al. | |
| 7,394,799 B2 | 7/2008 | Li et al. | |
| 7,426,201 B2 | 9/2008 | Kim et al. | |
| 7,558,228 B2 * | 7/2009 | Lee et al. | 370/312 |
| 7,693,110 B2 * | 4/2010 | Love et al. | 370/332 |
| 7,783,953 B2 | 8/2010 | Bolourchi et al. | |
| 2002/0051431 A1 | 5/2002 | Choi et al. | |
| 2002/0093918 A1 | 7/2002 | Kim et al. | |
| 2002/0181422 A1 | 12/2002 | Parantainen et al. | |
| 2003/0219037 A1 | 11/2003 | Toskala et al. | |
| 2004/0043783 A1 | 3/2004 | Anderson | |
| 2004/0085989 A1 | 5/2004 | Boumendil et al. | |

FOREIGN PATENT DOCUMENTS

| | | |
|---|---|---|
| EP | 0564825 | 10/1993 |
| EP | 1187500 | 3/2002 |
| EP | 1248476 | 10/2002 |
| EP | 1351424 | 10/2003 |
| GB | 2372409 | 8/2002 |
| JP | 01-196774 | 8/1989 |
| JP | 05-236073 | 9/1993 |
| JP | 08-316967 | 11/1996 |
| JP | 11-136138 | 5/1999 |
| JP | 11-196070 | 7/1999 |
| TW | 276382 | 5/1996 |
| WO | 99/38076 | 7/1999 |
| WO | 00/21210 | 4/2000 |
| WO | 00/28763 | 5/2000 |
| WO | 00/30378 | 5/2000 |
| WO | 00/57660 | 9/2000 |
| WO | 01/01609 | 1/2001 |
| WO | 01/05050 | 1/2001 |
| WO | 02/51177 | 6/2002 |
| WO | 02/051177 | 6/2002 |
| WO | 02/096030 | 11/2002 |

OTHER PUBLICATIONS

Balachandran et al., "Design of a Medium Access Control Feedback Mechanism for Cellular TDMA Packet Data Systems", IEEE Journal on Selected Areas in Communications, vol. 18, No. 9, pp. 1719-1730, (Sep. 2000).

Gourgue, "Air Interface of the Future European Fully Digital Trunk Radio System", Proceedings of the Vehicular Technology Conference, vol. CONF. 43, pp. 714-717 (May 1993).

Interdigital Communication Corporation, "Implicit UE Identification for HSDPA Downlink Signaling", TDOC R1-01-0810, 3GPP RAN WG1 Meeting 22, (Aug. 2001), available at: http://www.3gpp.org/ftp.tsg_ran/WG1_RL1.

Interdigital, "Updated Recommendation for UE-specific CRC", TDOC R1-01-1066, 3GPP TSG RAN WG 1 AD HOC Meeting On HSDPA, (Nov. 2001), available at: http://www.3gpp.org/ftp/tsg_ran/WG1_RL1.

Motorola, "Control Channel Structure for High Speed DSCH (HS-DSCH)," TSGR1#16(00) 1242, R2-12A010021, pp. 1-5 (Apr. 5-6, 2001).

Mouly et al. "Chapter 4, The Radio Interface," The GSM System for Mobile Communications; 1992, pp. 186-259.

3GPP TSG RAN WG 1 Tdoc R1-02-1277, Nokia, "Two Threshold Node B Packet Scheduling," Shanghai, China, Nov. 2002.

3GPP TSG RAN WG 1 Tdoc R1-02-1350, Motorola, "Design Considerations for Enhanced Uplink Dedicated Channel," Shanghai, China, Nov. 2002.

3GPP TSG RAN WG Tdoc R1-02-0018, Nokia, "Compact Signalling of Multi-code Allocation for HSDPA, version 2," Espoo, Finland, Jan. 2002.

Third Generation Partnership Project, "Technical Specification Group Radio Access Network; Multiplexing and channel coding (FDD) (Release 1999)," 3GPP TS 25.212 V3.5.0 (Dec. 2000).

Third Generation Partnership Project, "Technical Specification Group Radio Access Network; Multiplexing and channel coding (FDD) (Release 1999)," 3GPP TS 25.212 V3.7.0 (Sep. 2001).

Third Generation Partnership Project; Technical Specification Group Radio Access Network; Multiplexing and channel coding (FDD) (Release 1999) 3GPP TS 25.212 V3.11.0 (Sep. 2002).

Third Generation Partnershp Project, "Technical Specification Group Radio Access Network; Multiplexing and channel coding (FDD) (Release 4)," 3GPP TS 25.212 V4.0.0 (Dec. 2000).

Third Generation Partnership Project, "Technical Specification Group Radio Access Network; Multiplexing and channel coding (FDD) (Release 4)," 3GPP TS 25.212 V4.2.0 (Sep. 2001).

Third Generation Partnership Project; Technical Specification Group Radio Access Network; Multiplexing and channel coding (FDD) (Release 4) 3GPP TS 25.212 V4.6.0 (Sep. 2002).

Third Generation Partnership Project; Technical Specification Group Radio Access Network; Multiplexing and channel coding (FDD) (Release 5) 3GPP TS 25.212 V5.10.0 (Jun. 2005).

Third Generation Partnership Project; Technical Specification Group Radio Access Network; Multiplexing and channel coding (FDD) (Release 6) 3GPP TS 25.212 V6.10.0 (Dec. 2006).

Third Generation Partnership Project; Technical Specification Group Radio Access Network; Multiplexing and channel coding (FDD) (Release 7) 3GPP TS 25.212 V7.10.0 (Mar. 2009).

Third Generation Partnership Project; Technical Specification Group Radio Access Network; Multiplexing and channel coding (FDD) (Release 8) 3GPP TS 25.212 V8.6.0 (Sep. 2009).

Third Generation Partnership Project; Technical Specification Group Radio Access Network; Multiplexing and channel coding (FDD) (Release 9) 3GPP TS 25.212 V9.2.0 (Mar. 2010).

Third Generation Partnership Project, "Technical Specification Group Radio Access Network; Physical Layer Procedures (FDD) (Release 1999)," 3GPP TS 25.214 v3.6.0 (Mar. 2001).

Third Generation Partnership Project, "Technical Specification Group Radio Access Network; Physical Layer Procedures (FDD) (Release 1999)," 3GPP TS 25.214 v3.8.0 (Sep. 2001).

Third Generation Partnership Project; Technical Specification Group Radio Access Network; Physical layer procedures (FDD) (Release 1999) 3GPP TS 25.214 V3.12.0 (Mar. 2003).

Third Generation Partnership Project, "Technical Specification Group Radio Access Network; Physical Layer Procedures (FDD) (Release 4)," 3GPP TS 25.214 v4.0.0 (Mar. 2001).

Third Generation Partnership Project, "Technical Specification Group Radio Access Network; Physical Layer Procedures (FDD) (Release 4)." 3GPP TS 25.214 v4.2.0 (Sep. 2001).

Third Generation Partnership Project; Technical Specification Group Radio Access Network; Physical layer procedures (FDD) (Release 4) 3GPP TS 25.214 V4.6.0 (Mar. 2003).

Third Generation Partnership Project; Technical Specification Group Radio Access Network; Physical layer procedures (FDD) (Release 5) 3GPP TS 25.214 V5.11.0 (Jun. 2005).

Third Generation Partnership Project; Technical Specification Group Radio Access Network; Physical layer procedures (FDD) (Release 6) 3GPP TS 25.214 V6.11.0 (Dec. 2006).

Third Generation Partnership Project; Technical Specification Group Radio Access Network; Physical layer procedures (FDD) (Release 7) 3GPP TS 25.214 V7.15.0 (Mar. 2010).

Third Generation Partnership Project; Technical Specification Group Radio Access Network; Physical layer procedures (FDD) (Release 8) 3GPP TS 25.214 V8.9.0 (Mar. 2010).

Third Generation Partnership Project; Technical Specification Group Radio Access Network;Physical layer procedures (FDD) (Release 9) 3GPP TS 25.214 V9.2.0 (Mar. 2010).

Third Generation Partnership Project, "Technical Specification Group Radio Access Network; Physical channels and mapping of transport channels onto physical channels (TDD) (Release 1999)," 3GPP TS 25.221 V3.6.0 (Mar. 2001).

Third Generation Partnership Project, "Technical Specification Group Radio Access Network; Physical channels and mapping of transport channels onto physical channels (TDD) (Release 1999)," 3GPP TS 25.221 V3.8.0 (Sep. 2001).

Third Generation Partnership Project; Technical Specification Group Radio Access Network; Physical channels and mapping of transport channels onto physical channels (TDD) (Release 1999) 3GPP TS 25.221 V3.11.0 (Sep. 2002).

Third Generation Partnership Project, "Technical Specification Group Radio Access Network; Physical channels and mapping of transport channels onto physical channels (TDD) (Release 4)," 3GPP TS 25.221 V4.0.0 (Mar. 2001).

Third Generation Partnership Project, "Technical Specification Group Radio Access Network; Physical channels and mapping of transport channels onto physical channels (TDD) (Release 4)," 3GPP TS 25.221 V4.2.0 (Sep. 2001).

Third Generation Partnership Project; Technical Specification Group Radio Access Network; Physical channels and mapping of transport channels onto physical channels (TDD) (Release 4) 3GPP TS 25.221 V4.8.0 (Jun. 2005).

Third Generation Partnership Project; Technical Specification Group Radio Access Network; Physical channels and mapping of transport channels onto physical channels (TDD) (Release 5) 3GPP TS 25.221 V5.7.0 (Sep. 2008).

Third Generation Partnership Project; Technical Specification Group Radio Access Network; Physical channels and mapping of transport channels onto physical channels (TDD) (Release 6) 3GPP TS 25.221 V6.6.0 (Sep. 2008).

Third Generation Partnership Project; Technical Specification Group Radio Access Network; Physical channels and mapping of transport channels onto physical channels (TDD) (Release 7) 3GPP TS 25.221 V7.11.0 (May 2009).

Third Generation Partnership Project; Technical Specification Group Radio Access Network; Physical channels and mapping of transport channels onto physical channels (TDD) (Release 8) 3GPP TS 25.221 V8.9.0 (Jun. 2010).

Third Generation Partnership Project; Technical Specification Group Radio Access Network; Physical channels and mapping of transport channels onto physical channels (TDD) (Release 9) 3GPP TS 25.221 V9.2.1 (Jul. 2010).

Third Generation Partnership Project, "Technical Specification Group Radio Access Network; Multiplexing and channel coding (TDD) (Release 1999)," 3GPP TS 25.222 V3.6.0 (Mar. 2001).

Third Generation Partnership Project, "Technical Specification Group Radio Access Network; Multiplexing and channel coding (TDD) (Release 1999)," 3GPP TS 25.222 V3.7.0 (Sep. 2001).

Third Generation Partnership Project; Technical Specification Group Radio Access Network; Multiplexing and channel coding (TDD) (Release 1999) 3GPP TS 25.222 V3.10.0 (Sep. 2002).

Third Generation Partnership Project, "Technical Specification Group Radio Access Network; Multiplexing and channel coding (TDD) (Release 4)," 3GPP TS 25.222 V4.0.0 (Mar. 2001).

Third Generation Partnership Project, "Technical Specification Group Radio Access Network; Multiplexing and channel coding (TDD) (Release 4)," 3GPP TS 25.222 V4.1.0 (Sep. 2001).

Third Generation Partnership Project; Technical Specification Group Radio Access Network; Multiplexing and channel coding (TDD) (Release 4) 3GPP TS 25.222 V4.8.0 (Sep. 2004).

Third Generation Partnership Project; Technical Specification Group Radio Access Network; Multiplexing and channel coding (TDD) (Release 5) 3GPP TS 25.222 V5.8.0 (Mar. 2009).

Third Generation Partnership Project; Technical Specification Group Radio Access Network; Multiplexing and channel coding (TDD) (Release 6) 3GPP TS 25.222 V6.3.0 (Mar. 2009).

Third Generation Partnership Project; Technical Specification Group Radio Access Network; Multiplexing and channel coding (TDD) (Release 7) 3GPP TS 25.222 V7.11.0 (May 2009).

Third Generation Partnership Project; Technical Specification Group Radio Access Network; Multiplexing and channel coding (TDD) (Release 8) 3GPP TS 25.222 V8.9.0 (Jun. 2010).

Third Generation Partnership Project; Technical Specification Group Radio Access Network; Multiplexing and channel coding (TDD) (Release 9) 3GPP TS 25.222 V9.2.0 (Jun. 2010).

Third Generation Partnership Project, "Technical Specification Group Radio Access Network; UTRA High Speed Downlink Packet Access (HSDPA); Overall Description; Stage 2 (Release 5)," 3GPP TS 25.308 V5.0.0 (Sep. 2001).

Third Generation Partnership Project; Technical Specification Group Radio Access Network; High Speed Downlink Packet Access (HSDPA); Overall description; Stage 2 (Release 5) 3GPP TS 25.308 V5.7.0 (Dec. 2004).

Third Generation Partnership Project; Technical Specification Group Radio Access Network; High Speed Downlink Packet Access (HSDPA); Overall description; Stage 2 (Release 6) 3GPP TS 25.308 V6.4.0 (Mar. 2007).

Third Generation Partnership Project; Technical Specification Group Radio Access Network; High Speed Downlink Packet Access (HSDPA); Overall description; Stage 2 (Release 7) 3GPP TS 25.308 V7.11.0 (Sep. 2010).

Third Generation Partnership Project; Technical Specification Group Radio Access Network; High Speed Downlink Packet Access (HSDPA); Overall description; Stage 2 (Release 8) 3GPP TS 25.308 V8.8.0 (Mar. 2010).

Third Generation Partnership Project; Technical Specification Group Radio Access Network; High Speed Downlink Packet Access (HSDPA); Overall description; Stage 2 (Release 9) 3GPP TS 25.308 V9.3.0 (Jun. 2010).

Third Generation Partnership Project; Technical Specification Group Radio Access Network; High Speed Downlink Packet Access (HSDPA); Overall description; Stage 2 (Release 10) 3GPP TS 25.308 V10.1.0 (Jun. 2010).

Third Generation Partnership Project, "Technical Specification Group Radio Access Network; UTRAN Overall Description (Release 1999)," 3GPP TS 25.401 V3.6.0 (Mar. 2001).

Third Generation Partnership Project, "Technical Specification Group Radio Access Network; UTRAN Overall Description (Release 1999)," 3GPP TS 25.401 V3.8.0 (Sep. 2001).

Third Generation Partnership Project; Technical Specification Group Radio Access Network; UTRAN Overall Description (Release 1999) 3GPP TS 25.401 V3.10.0 (Jun. 2002).

Third Generation Partnership Project, "Technical Specification Group Radio Access Network; UTRAN Overall Description (Release 4)," 3GPP TS 25.401 V4.0.0 (Mar. 2001).

Third Generation Partnership Project, "Technical Specification Group Radio Access Network; UTRAN Overall Description (Release 4)," 3GPP TS 25.401 V4.2.0 (Sep. 2001).

Third Generation Partnership Project; Technical Specification Group Radio Access Network; UTRAN overall description (Release 4) 3GPP TS 25.401 V4.6.0 (Dec. 2002).

Third Generation Partnership Project, "Technical Specification Group Radio Access Network; UTRAN Overall Description (Release 5)," 3GPP TS 25.401 V5.1.0 (Sep. 2001).

Third Generation Partnership Project; Technical Specification Group Radio Access Network; UTRAN overall description (Release 5) 3GPP TS 25.401 V5.10.0 (Jun. 2005).

Third Generation Partnership Project; Technical Specification Group Radio Access Network; UTRAN overall description (Release 6) 3GPP TS 25.401 V6.9.0 (Dec. 2006).

Third Generation Partnership Project; Technical Specification Group Radio Access Network; UTRAN overall description (Release 7) 3GPP TS 25.401 V7.6.0 (Jun. 2008).

Third Generation Partnership Project; Technical Specification Group Radio Access Network; UTRAN overall description (Release 8) 3GPP TS 25.401 V8.2.0 (Dec. 2008).

Third Generation Partnership Project; Technical Specification Group Radio Access Network; UTRAN overall description (Release 9) 3GPP TS 25.401 V9.1.0 (Mar. 2010).
Third Generation Partnership Project, "Technical Specification Group Radio Access Network; High Speed Downlink Packet Access; Overall UTRAN Description (Release 5)," 3GPP TR 25.855 v0.0.3; (May 2001).
Third Generation Partnership Project, "Technical Specification Group Radio Access Network; High Speed Downlink Packet Access; Overall UTRAN Description (Release 5)," 3GPP TR 25.855 V5.0.0 (Sep. 2001).
Third Generation Partnership Project; Technical Specification Group Radio Access Network; Feasibility Study for Enhanced Uplink for UTRA FDD; (Release 6) 3GPP TR 25.896 V1.3.2 (Feb. 2004).
Third Generation Partnership Project; Technical Specification Group Radio Access Network; Feasibility Study for Enhanced Uplink for UTRA FDD; (Release 6) 3GPP TR 25.896 V2.0.0 (Mar. 2004).
Third Generation Partnership Project, "Technical Specification Group Radio Access Network; Feasibility Study for Enhanced Uplink for UTRA FDD (Release 6)," 3GPP TR 25.896 V6.0.0 (Mar. 2004).
Third Generation Partnership Project; Technical Specification Group Radio Access Network; Evolved Universal Terrestrial Radio Access (E-UTRA); Multiplexing and channel coding (Release 8) 3GPP TS 36.212 V8.8.0 (Dec. 2009).
Third Generation Partnership Project; Technical Specification Group Radio Access Network; Evolved Universal Terrestrial Radio Access (E-UTRA); Multiplexing and channel coding (Release 9) 3GPP TS 36.212 V9.2.0 (Jun. 2010).
Third Generation Partnership Project; Technical Specification Group Radio Access Network; Evolved Universal Terrestrial Radio Access (E-UTRA); Physical layer procedures (Release 8) 3GPP TS 36.213 V8.8.0 (Sep. 2009).
Third Generation Partnership Project; Technical Specification Group Radio Access Network; Evolved Universal Terrestrial Radio Access (E-UTRA); Physical layer procedures (Release 9) 3GPP TS 36.213 V9.2.0 (Jun. 2010).
"DL Control Channel Structures for Parameters Sent Simultaneously With HS-DSCH TTI." TSG-RAN WG1/WG2 Adhoc on HSDPA, Sophia Antipolis, France, (Apr. 5-6, 2001).
Balachandran et al., "Design of a Medium Access Control Feedback Mechanism for Cellular TDMA Packet Data Systems", IEEE Journal on Selected Areas in Communications, vol. 18, No. 9, pp. 1719-1730, (Sep. 2000).
Gourgue, "Air Interface of the Future European Fully Digital Trunk Radio System", Proceedings of the Vehicular Technology Conference, vol. CONF. 43, pp. 714-717 (May 1993).
Interdigital Communication Corporation, "Implicit UE Identification for HSDPA Downlink Signaling", TDOC R1-01-0810, 3GPP RAN WG1 Meeting 22, (Aug. 2001), available at: http://www.3gpp.org/ftp.tsg_ran/WG1_RL1.
Interdigital, "Updated Recommendation for UE-specific CRC", TDOC R1-01-1066, 3GPP TSG RAN WG 1 ADHOC Meeting On HSDPA, (Nov. 2001), available at: http://www.3gpp.org/ftp/tsg_ran/WG1_RL1.
Motorola, "Control Channel Structure for High Speed DSCH (HS-DSCH)," TSGR1#16(00) 1242, R2-12A010021, pp. 1-5 (Apr. 5-6, 2001).
Mouly et al. "Chapter 4, The Radio Interface," The GSM System for Mobile Communications; 1992, pp. 186-259.
3GPP TSG RAN WG 1 Tdoc R1-02-1277, Nokia, "Two Threshold Node B Packet Scheduling," Shanghai, China, Nov. 2002.
3GPP TSG RAN WG 1 Tdoc R1-02-1350, Motorola, "Design Considerations for Enhanced Uplink Dedicated Channel," Shanghai, China, Nov. 2002.
3GPP TSG RAN WG Tdoc R1-02-0018, Nokia, "Compact Signalling of Multi-code Allocation for HSDPA, version 2," Espoo, Finland, Jan. 2002.
Third Generation Partnership Project, "Technical Specification Group Radio Access Network; Multiplexing and channel coding (FDD) (Release 1999)," 3GPP TS 25.212 V3.5.0 (Dec. 2000).
Third Generation Partnership Project, "Technical Specification Group Radio Access Network; Multiplexing and Channel coding (FDD) (Release 1999)," 3GPP TS 25.212 V3.7.0 (Sep. 2001).
Third Generation Partnership Project; Technical Specification Group Radio Access Network; Multiplexing and channel coding (FDD) (Release 1999) 3GPP TS 25.212 V3.11.0 (Sep. 2002).
Third Generation Partnershp Project, "Technical Specification Group Radio Access Network; Multiplexing and channel coding (FDD) (Release 4)," 3GPP TS 25.212 V4.0.0 (Dec. 2000).
Third Generation Partnership Project, "Technical Specification Group Radio Access Network; Multiplexing and channel coding (FDD) (Release 4)," 3GPP TS 25.212 V4.2.0 (Sep. 2001).
Third Generation Partnership Project; Technical Specification Group Radio Access Network; Multiplexing and channel coding (FDD) (Release 4) 3GPP TS 25.212 V4.60 (Sep. 2002).
Third Generation Partnership Project; Technical Specification Group Radio Access Network; Multiplexing and channel coding (FDD) (Release 5) 3GPP TS 25.212 V5.10.0 (Jun. 2005).
Third Generation Partnership Project; Technical Specification Group Radio Access Network; Multiplexing and channel coding (FDD) (Release 6) 3GPP TS 25.212 V6.10.0 (Dec. 2006).
Third Generation Partnership Project; Technical Specification Group Radio Access Network; Multiplexing and channel coding (FDD) (Release 7) 3GPP TS 25.212 V7.10.0 (Mar. 2009).
Third Generation Partnership Project; Technical Specification Group Radio Access Network; Multiplexing and channel coding (FDD) (Release 8) 3GPP TS 25.212 V8.6.0 (Sep. 2009).
Third Generation Partnership Project; Technical Specification Group Radio Access Network; Multiplexing and channel coding (FDD) (Release 9) 3GPP TS 25.212 V9.2.0 (Mar. 2010).
Third Generation Partnership Project, "Technical Specification Group Radio Access Network; Physical Layer Procedures (FDD) (Release 1999)," 3GPP TS 25.214 v3.6.0 (Mar. 2001).
Third Generation Partnership Project, "Technical Specification Group Radio Access Network; Physical Layer Procedures (FDD) (Release 1999)," 3GPP TS 25.214 v3.8.0 (Sep. 2001).
Third Generation Partnership Project; Technical Specification Group Radio Access Network; Physical layer procedures (FDD) (Release 1999) 3GPP TS 25.214 V3.12.0 (Mar. 2003).
Third Generation Partnership Project, "Technical Specification Group Radio Access Network; Physical Layer Procedures (FDD) (Release 4)," 3GPP TS 25.214 v4.0.0 (Mar. 2001).
Third Generation Partnership Project, "Technical Specification Group Radio Access Network; Physical Layer Procedures (FDD) (Release 4)." 3GPP TS 25.214 v4.2.0 (Sep. 2001).
Third Generation Partnership Project; Technical Specification Group Radio Access Network; Physical layer procedures (FDD) (Release 4) 3GPP TS 25.214 V4.6.0 (Mar. 2003).
Third Generation Partnership Project; Technical Specification Group Radio Access Network; Physical layer procedures (FDD) (Release 5) 3GPP TS 25.214 V5.11.0 (Jun. 2005).
Third Generation Partnership Project; Technical Specification Group Radio Access Network; Physical layer procedures (FDD) (Release 6) 3GPP TS 25.214 V6.11.0 (Dec. 2006).
Third Generation Partnership Project; Technical Specification Group Radio Access Network;Physical layer procedures (FDD) (Release 7) 3GPP TS 25.214 V.7.15.0 (Mar. 2010).
Third Generation Partnership Project; Technical Specification Group Radio Access Network; Physical layer procedures (FDD) (Release 8) 3GPP TS 25.214 V8.9.0 (Mar. 2010).
Third Generation Partnership Project; Technical Specification Group Radio Access Network; Physical layer procedures (FDD) (Release 9) 3GPP TS 25.214 V9.2.0 (Mar. 2010).
Third Generation Partnership Project, "Technical Specification Group Radio Access Network; Physical channels and mapping of transport channels onto physical channels (TDD) (Release 1999)," 3GPP TS 25.221 V3.6.0 (Mar. 2001).
Third Generation Partnership Project, "Technical Specification Group Radio Access Network; Physical channels and mapping of transport channels onto physical channels (TDD) (Release 1999)," 3GPP TS 25.221 V3.8.0 (Sep. 2001).

Third Generation Partnership Project; Technical Specification Group Radio Access Network; Physical channels and mapping of transport channels onto physical channels (TDD) (Release 1999) 3GPP TS 25.221 V3.11.0 (Sep. 2002).
Third Generation Partnership Project, "Technical Specification Group Radio Access Network; Physical channels and mapping of transport channels onto physical channels (TDD) (Release 4)," 3GPP TS 25.221 V4.0.0 (Mar. 2001).
Third Generation Partnership Project, "Technical Specification Group Radio Access Network; Physical channels and mapping of transport channels onto physical chanels (TDD) (Release 4)," 3GPP TS 25.221 V4.2.0 (Sep. 2001).
Third Generation Partnership Project; Technical Specification Group Radio Access Network; Physical channels and mapping of transport channels onto physical channels (TDD) (Release 4) 3GPP TS 25.221 V4.8.0 (Jun. 2005).
Third Generation Partnership Project; Technical Specification Group Radio Access Network; Physical channels and mapping of transport channels onto physical channels (TDD) (Release 5) 3GPP TS 25.221 V5.7.0 (Sep. 2008).
Third Generation Partnership Project; Technical Specification Group Radio Access Network; Physical channels and mapping of transport channels onto physical channels (TDD) (Release 6) 3GPP TS 25.221 V6.6.0 (Sep. 2008).
Third Generation Partnership Project; Technical Specification Group Radio Access Network; Physical channels and mapping of transport channels onto physical channels (TDD) (Release 7) 3GPP TS 25.221 V7.11.0 (May 2009).
Third Generation Partnership Project; Technical Specification Group Radio Access Network; Physical channels and mapping of transport channels onto physical channels (TDD) (Release 8) 3GPP TS 25.221 V8.9.0 (Jun. 2010).
Third Generation Partnership Project; Technical Specification Group Radio Access Network; Physical channels and mapping of transport channels onto physical channels (TDD) (Release 9) 3GPP TS 25.221 V9.2.1 (Jul. 2010).
Third Generation Partnership Project, "Technical Specification Group Radio Access Network; Multiplexing and channel coding (TDD) (Release 1999)," 3GPP TS 25.222 V3.6.0 (Mar. 2001).
Third Generation Partnership Project, "Technical Specification Group Radio Access Network; Multiplexing and channel coding (TDD) (Release 1999)," 3GPP TS 25.222 V3.7.0 (Sep. 2001).
Third Generation Partnership Project; Technical Specification Group Radio Access Network; Multiplexing and channel coding (TDD) (Release 1999) 3GPP TS 25.222 V3.10.0 (Sep. 2002).
Third Generation Partnership Project, "Technical Specification Group Radio Access Network; Multiplexing and channel coding (TDD) (Release 4)," 3GPP TS 25.222 V4.0.0 (Mar. 2001).
Third Generation Partnership Project, "Technical Specification Group Radio Access Network; Multiplexing and channel coding (TDD) (Release 4)," 3GPP TS 25.222 V4.1.0 (Sep. 2001).
Third Generation Partnership Project; Technical Specification Group Radio Access Network; Multiplexing and channel coding (TDD) (Release 4) 3GPP TS 25.222 V4.8.0 (Sep. 2004).
Third Generation Partnership Project; Technical Specification Group Radio Access Network; Multiplexing and channel coding (TDD) (Release 5) 3GPP TS 25.222 V5.8.0 (Mar. 2009).
Third Generation Partnership Project; Technical Specification Group Radio Access Network; Multiplexing and channel coding (TDD) (Release 6) 3GPP TS 25.222 V6.3.0 (Mar. 2009).
Third Generation Partnership Project; Technical Specification Group Radio Access Network; Multiplexing and channel coding (TDD) (Release 7) 3GPP TS 25.222 V7.11.0 (May 2009).
Third Generation Partnership Project; Technical Specification Group Radio Access Network; Multiplexing and channel coding (TDD) (Release 8) 3GPP TS 25.222 V8.9.0 (Jun. 2010).
Third Generation Partnership Project; Technical Specification Group Radio Access Network; Multiplexing and channel coding (TDD) (Release 9) 3GPP TS 25.222 V9.2.0 (Jun. 2010).
Third Generation Partnership Project, "Technical Specification Group Radio Access Network; UTRA High Speed Downlink Packet Access (HSDPA); Overall Description; Stage 2 (Release 5)," 3GPP TS 25.308 V5.0.0 (Sep. 2001).
Third Generation Partnership Project; Technical Specification Group Radio Access Network; High Speed Dounlink Packet Access (HSDPA); Overall description; Stage 2 (Release 5) 3GPP TS 25.308 V5.7.0 (Dec. 2004).
Third Generation Partnership Project; Technical Specification Group Radio Access Network; High Speed Downlink Packet Access (HSDPA); Overall description; Stage 2 (Release 6) 3GPP TS 25.308 V6.4.0 (Mar. 2007).
Third Generation Partnership Project; Technical Specification Group Radio Access Network; High Speed Downlink Packet Access (HSDPA); Overall description; Stage 2 (Release 7) 3GPP TS 25.308 V7.11.0 (Sep. 2010).
Third Generation Partnership Project; Technical Specification Group Radio Access Network; High Speed Downlink Packet Access (HSDPA); Overall description; Stage 2 (Release 8) 3GPP TS 25.308 V8.8.0 (Mar. 2010).
Third Generation Partnership Project; Technical Specification Group Radio Access Network; High Speed Downlink Packet Access (HSDPA); Overall description; Stage 2 (Release 9) 3GPP TS 25.308 V9.3.0 (Jun. 2010).
Third Generation Partnership Project; Technical Specification Group Radio Access Network; High Speed Downlink Packet Access (HSDPA); Overall description; Stage 2 (Release 10) 3GPP TS 25.308 V10.1.0 (Jun. 2010).
Third Generation Partnership Project, "Technical Specification Group Radio Access Network; UTRAN Overall Description (Release 1999)," 3GPP TS 25.401 V3.6.0 (Mar. 2001).
Third Generation Partnership Project, "Technical Specification Group Radio Access Network; UTRAN Overall Description (Release 1999)," 3GPP TS 25.401 V3.8.0 (Sep. 2001).
Third Generation Partnership Project; Technical Specification Group Radio Access Network; UTRAN Overall Description (Release 1999) 3GPP TS 25.401 V3.10.0 (Jun. 2002).
Third Generation Partnership Project, "Technical Specification Group Radio Access Network; UTRAN Overall Description (Release 4)," 3GPP TS 25.401 V4.0.0 (Mar. 2001).
Third Generation Partnership Project, "Technical Specification Group Radio Access Network; UTRAN Overall Description (Release 4)," 3GPP TS 25.401 V4.2.0 (Sep. 2001).
Third Generation Partnership Project; Technical Specification Group Radio Access Network; UTRAN overall description (Release 4) 3GPP TS 25.401 V4.6.0 (Dec. 2002).
Third Generation Partnership Project, "Technical Specification Group Radio Access Network; UTRAN Overall Description (Release 5)," 3GPP TS 25.401 V5.1.0 (Sep. 2001).
Third Generation Partnership Project; Technical Specification Group Radio Access Network; UTRAN overall description (Release 5) 3GPP TS 25.401 V5.10.0 (Jun. 2005).
Third Generation Partnership Project; Technical Specification Group Radio Access Network; UTRAN overall description (Release 6) 3GPP TS 25.401 V6.9.0 (Dec. 2006).
Third Generation Partnership Project; Technical Specification Group Radio Access Network; UTRAN overall description (Release 7) 3GPP TS 25.401 V7.6.0 (Jun. 2008).
Third Generation Partnership Project; Technical Specification Group Radio Access Network; UTRAN overall description (Release 8) 3GPP TS 25.401 V8.2.0 (Dec. 2008).
Third Generation Partnership Project; Technical Specification Group Radio Access Network; UTRAN overall description (Release 9) 3GPP TS 25.401 V9.1.0 (Mar. 2010).
Third Generation Partnership Project, "Technical Specification Group Radio Access Network; High Speed Downlink Packet Access; Overall UTRAN Description (Release 5)," 3GPP TR 25.855 v0.0.3; (May 2001).
Third Generation Partnership Project, "Technical Specification Group Radio Access Network; High Speed Downlink Packet Access; Overall UTRAN Description (Release 5)," 3GPP TR 25.855 V5.0.0 (Sep. 2001).

Third Generation Partnership Project; Technical Specification Group Radio Access Network; Feasibility Study for Enhanced Uplink for UTRA FDD; (Release 6) 3GPP TR 25.896 V1.3.2 (Feb. 2004).

Third Generation Partnership Project; Technical Specification Group Radio Access Network; Feasibility Study for Enhanced Uplink for UTRA FDD; (Release 6) 3GPP TR 25.896 V2.0.0 (Mar. 2004).

Third Generation Partnership Project, "Technical Specification Group Radio Access Network; Feasibility Study for Enhanced Uplink for UTRA FDD (Release 6)," 3GPP TR 25.896 V6.0.0 (Mar. 2004).

Third Generation Partnership Project; Technical Specification Group Radio Access Network; Evolved Universal Terrestrial Radio Access (E-UTRA); Multiplexing and channel coding (Release 8) 3GPP TS 36.212 V8.8.0 (Dec. 2009).

Third Generation Partnership Project; Technical Specification Group Radio Access Network; Evolved Universal Terrestrial Radio Access (E-UTRA); Multiplexing and channel coding (Release 9) 3GPP TS 36.212 V9.2.0 (Jun. 2010).

Third Generation Partnership Project; Technical Specification Group Radio Access Network; Evolved Universal Terrestrial Radio Access (E-UTRA); Physical layer procedures (Release 8) 3GPP TS 36.213 V8.8.0 (Sep. 2009).

Third Generation Partnership Project; Technical Specification Group Radio Access Network; Evolved Universal Terrestrial Radio Access (E-UTRA); Physical layer procedures (Release 9) 3GPP TS 36.213 V9.2.0 (Jun. 2010).

* cited by examiner

ASSOCIATED DOWNLINK CHANNEL (DPCH)
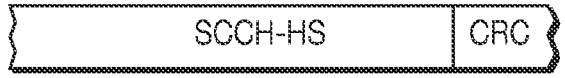
HS-DSCH INDICATOR (HI)
*FIG. 1A*
PRIOR ART
HI
CONTROL CHANNELS
00 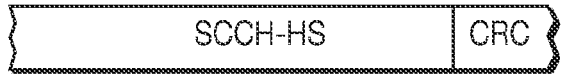
01 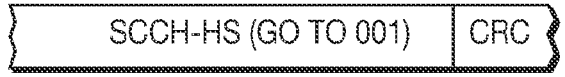
→ 10 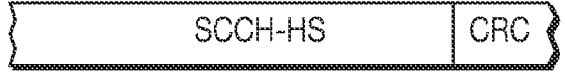
11 
*FIG. 1B*
PRIOR ART
CONTROL CHANNELS
000 
→ 001 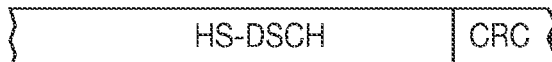
010 
⋮
111
*FIG. 1C*
PRIOR ART
*FIG. 1D*
PRIOR ART

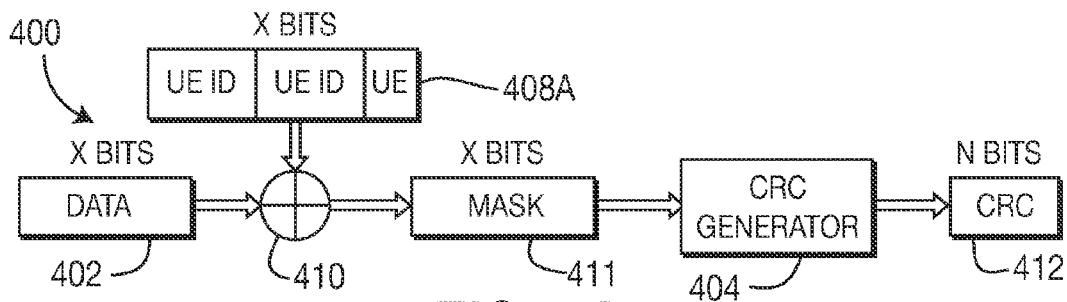
*FIG. 7A*
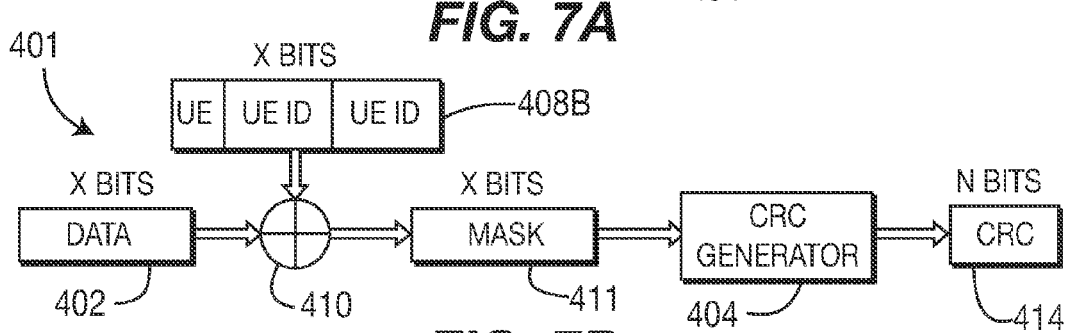
*FIG. 7B*
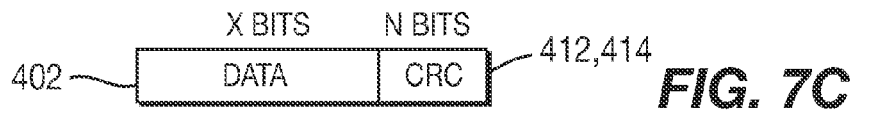
*FIG. 7C*
| GLOBAL ID | | | | | | ALTERNATE GROUP IDs |
|---|---|---|---|---|---|---|
| SUBSET 1 ID | | SUBSET 2 ID | | SUBSET 3 ID | | |
| SUBSUBSET A ID | SUBSUBSET B ID | SUBSUBSET C ID | SUBSUBSET D ID | SUBSUBSET E ID | SUBSUBSET F ID | |
| UE #1 | UE #6 | UE #11 | UE #16 | UE #21 | UE #26 | GROUP A |
| UE #2 | UE #7 | UE #12 | UE #17 | UE #22 | UE #27 | GROUP B |
| UE #3 | UE #8 | UE #13 | UE #18 | UE #23 | UE #28 | GROUP C |
| UE #4 | UE #9 | UE #14 | UE #19 | UE #24 | UE #29 | GROUP D |
| UE #5 | UE #10 | UE #15 | UE #20 | UE #25 | UE #30 | GROUP E |
*FIG. 8*
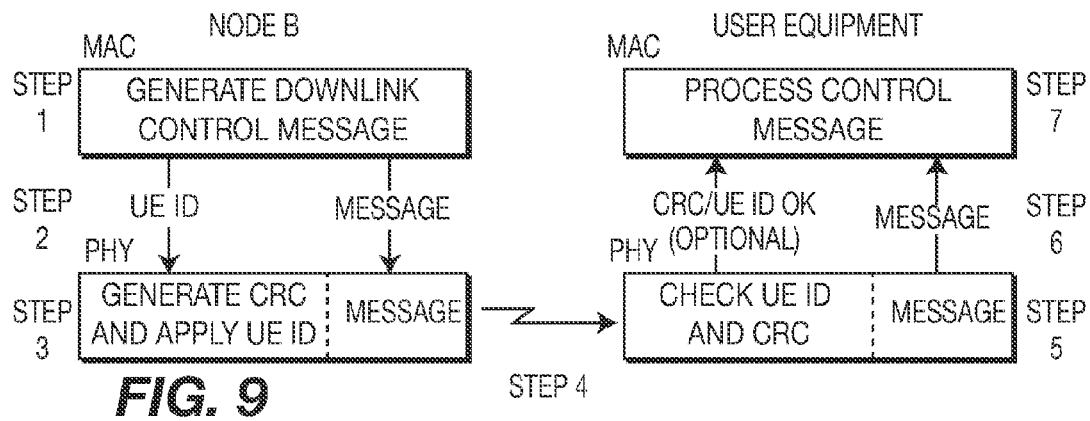
*FIG. 9*

US 8,051,360 B2

METHOD AND APPARATUS FOR PROCESSING A DOWNLINK SHARED CHANNEL

CROSS REFERENCE TO RELATED APPLICATIONS

This application is a continuation of U.S. patent application Ser. No. 11/129,850, filed May 16, 2005, which issued as U.S, Pat. No. 7,783,953 on Aug. 24, 2010, which is a continuation of U.S. patent application Ser. No. 10/035,771, filed Dec. 26, 2001, which issued as U.S. Pat. No. 6,915,473 on Jul. 5, 2005, which claims the benefit of U.S. Provisional Application Nos. 60/290,740, filed May 14, 2001; 60/314,993, filed Aug. 24, 2001; and 60/345,358, filed Oct. 25, 2001, which are incorporated by reference as if fully set forth herein.

BACKGROUND

The present invention relates to the field of wireless communications. One of the applications of the present invention is directed to a downlink signaling approach employing a modified cyclic redundancy check for both data protection and unique/group UE identification.

Wireless communication systems have become an integral link in today's modern telecommunications infrastructure. As such, they have become increasingly relied upon not only to support voice communications, but also data communications. Voice communications are relatively low-rate, symmetrical in the upstream and downstream bandwidths and are predictable in the amount of bandwidth required.

However, data communications can place severe burdens upon a telecommunication system, particularly a wireless telecommunication system. First, data communications can often require extremely high data rates. Second, the amount of bandwidth for a data related application can vary greatly from several kilohertz of bandwidth to several megahertz. Third, the amount of bandwidth in the upstream and downstream directions can be drastically different. For example, with a typical Internet browsing application, very little data is sent in the upstream direction while vast amounts of data are downloaded in the downstream direction. These factors can place severe constraints upon a wireless telecommunication system.

The Wideband CDMA (WCDMA) standard, as the leading global third generation (3G) (IMT-2000) standard, supports data rates up to 2 Mb/s in indoor/small-cell-outdoor environments and up to 384 kb/switch wide-area coverage, as well as support for both high-rate packet data and high-rate circuit-switched data. However to satisfy the future demands for packet-data services, there is a need for a substantial increase in this data rate, especially in the downlink. High speed downlink packet access (HSDPA) would allow WCDMA to support downlink peak data rates in the range of approximately 8-10 Mb/s for best-effort packet-data services. This rate is far beyond the IMT-2000 requirement of 2 Mb/s. It also enhances the packet-data capability in terms of lower delay and improved capacity.

One solution for supporting data communications is the allocation of dedicated channels to each user equipment (UE). However, this results in an extremely inefficient use of the bandwidth since such channels often remain idle for long durations.

An alternative to dedicated channels for each UE is the use of the high speed shared data channels and the packeting of data. In this method, a plurality of high speed data channels are shared between a plurality of UEs. Those UEs having data for transmission or reception are dynamically assigned one of the shared data channels. This results in a much more efficient use of the spectrum.

One such process for assigning a high speed shared data channel when a base station has data waiting for transmission to a particular UE is shown in FIGS. 1A-1C. Referring to FIG. 1A, an associated downlink dedicated physical channel (DPCH) is transmitted to each UE. The UE monitors associated downlink DPCH as well as the shared control channels (SCCH-HS). When there is no data being transmitted to the UE from the base station, the UE enters a standby mode whereby it periodically "wakes up" to attempt to monitor its associated downlink DPCH as well as SCCH-HSs. This permits the UE to save processing and battery resources.

If data at the base station is ready for transmission to the UE, a High Speed Downlink Shared Channel (HS-DSCH) indicator (HI) is transmitted in the associated DPCH. The HI has n-bit length, which points to one of $2^n$ SCCH-HSs shown in FIG. 1B. For example a 2 bit HI can point to 4 SCCH-HSs, i.e., 00, 01, 10 or 11.

For the example shown in FIG. 1A, the HI is (1, 0) which points to the third channel shown in FIG. 1B. When the UE accesses the control channel identified by the HI, that particular SCCH-HS will direct the UE to the proper HS-DSCH, which has been allocated to the UE for reception of the data. As shown in FIG. 1C, for example, the UE tunes to HS-DSCH (001) that was identified by SCCH-HS (1, 0). The UE then receives the data intended for it over the HS-DSCH (001). It should be noted that the graphical representation of FIG. 1A-1C has been presented to illustrate the process of assigning HS-DSCHs, and the configuration and use of channels may differ slightly from actual implementation in HSDPA standards.

The process as described with reference to FIGS. 1A-1C provides an efficient method for assigning common data channels for transmission of data. Since packet data is intended for one or more, specific UEs, the UE identity (ID) is a critical parameter for signaling from the base station to the UE.

There are several prior art methods for signaling the UE ID between the base station and the UE. Referring to FIG. 2A, the first method appends the UE ID onto the data for transmission. The combination is fed to a cyclic redundancy check (CRC) generator, which outputs a CRC. The resulting data packet, which is ultimately transmitted, includes an X-bit data field, an M-bit UE ID and an N-bit CRC as shown in FIG. 2B. Although this provides adequate signaling of both the CRC and the UE ID, it is wasteful of signaling bandwidth.

Another prior art technique shown in FIG. 3A appends the UE ID onto the data field for input into the CRC generator. The CRC generator outputs a CRC. As shown in FIG. 3B, the data burst for transmission includes an X-bit data field and an N-bit CRC field. Although this also adequately signals the UE ID and the CRC between the base station and the UE, it is undesirable since it can only be used for unique UE identification. This method also causes increased complexity of the UE when a group of UEs need to be identified.

SUMMARY

A method and apparatus is disclosed wherein a user equipment (UE) receives control information on a first channel and uses the control information to process a second channel.

BRIEF DESCRIPTION OF THE DRAWINGS

FIGS. 1A-1C represent a prior art method for assigning shared data channels, where FIG. 1A illustrates the associated downlink channel, FIG. 1B illustrates a plurality of control channels and FIG. 1C illustrates a plurality of data channels.

FIG. 1D is a block diagram of the universal mobile telecommunication system network architecture.

FIG. 7A is a fifth embodiment of the present invention which modulo 2 adds the data field to a UE ID field repeated and padded a truncated UE ID in the trailing bits.

FIG. 7B is a sixth embodiment of the present invention which modulo 2 adds the data field to a UE ID field repeated and padded a truncated UE ID in the leading bits.

FIG. 7C is the data burst transmitted by the embodiments of FIG. 7A and 7B including a data field and a CRC field.

FIG. 8 is a tabulation of global, subset, subsubset and unique IDs.

FIG. 9 is a flow diagram of the processing of a message in accordance with the present invention.

DETAILED DESCRIPTION OF THE PREFERRED EMBODIMENTS

Figure 2A:
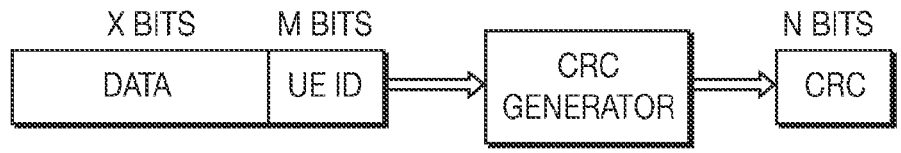
FIG. 2A is a prior art user equipment identification (UE ID) specific cyclic redundancy check (CRC) method.
Figure 2B:
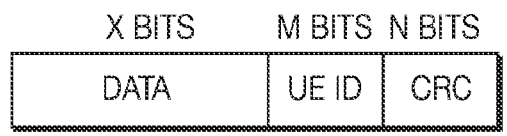
FIG. 2B illustrates the transmitted data burst including a data field, a UE ID field and a CRC field.
Figure 3A:
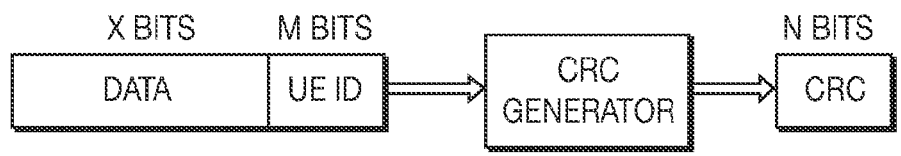
FIG. 3A is a second prior art user equipment identification (UE ID) specific cyclic redundancy check (CRC) method.
Figure 3B:
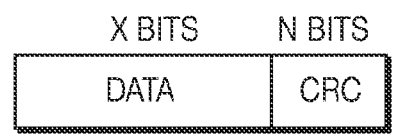
FIG. 3B illustrates the transmitted data burst including a data field and a CRC field.

The presently preferred embodiments are described below with reference to the drawing figures wherein like numerals represent like elements throughout.

Referring to FIG. 1D, a Universal Mobile Telecommunications System (UMTS) network architecture used by the present invention includes a core network (CN), a UMTS Terrestrial Radio Access Network (UTRAN), and a User Equipment (UE). The two general interfaces are the Iu interface, between the UTRAN and the core network, as well as the radio interface Uu, between the UTRAN and the UE. The UTRAN consists of several Radio Network Subsystems (RNS). They can be interconnected by the Iur interface. This interconnection allows core network independent procedures between different RNSs. The RNS is further divided into the Radio Network Controller (RNC) and several base stations (Node-B). The Node-Bs are connected to the RNC by the Iub interface. One Node-B can serve one or multiple cells, and typically serves a plurality of UEs. The UTRAN supports both FDD mode and TDD mode on the radio interface. For both modes, the same network architecture and the same protocols are used. Only the physical layer and the air interface Uu are specified separately.

Figure 4A:
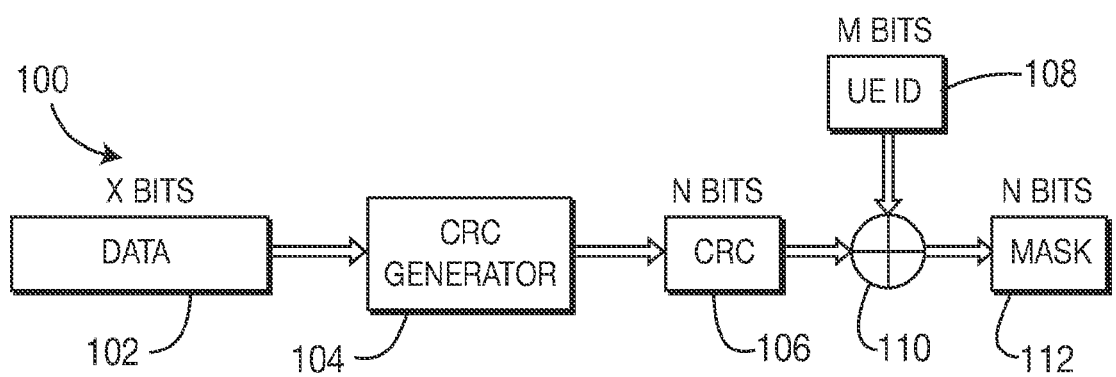
FIG. 4A is a first embodiment of the present invention utilizing modulo 2 addition of the UE ID with the CRC to create a mask.

Referring to FIG. 4A, one embodiment of the present invention is shown. In this embodiment, the system 100 utilizes the data for transmission (hereinafter referred to as "data") from the data field 102, a CRC generator 104 (which has been initialized to zero), the resulting CRC from the CRC field 106 output from the CRC generator 104, the UE ID from the UE ID field 108, a modulo 2 adder 110 and a mask 112. It should be noted that in this embodiment and all of the embodiments described hereinafter, the number of bits of each field is noted above the field as an example. However, the specific number of bits is exemplary and should not be construed to limit the present invention.

The system 100 receives the data field 102 and inputs the data from the data field 102 into the CRC generator 104. The CRC generator 104 generates the CRC field 106 and outputs the CRC from the CRC field 106 to a first input of the modulo 2 adder 110. The UE ID from the UE ID field 108 is output to the second input to the modulo 2 adder 110. The CRC and UE ID are then modulo 2 added to create a mask 112.

Preferably, the number of bits of the UE ID field 108 (M bits) is the same as the number of bits of the CRC field 106 (N bits). If M=N, then the UE ID may be directly modulo 2 added to the CRC as shown in FIG. 4A. However, if M and N are not equal, then an interim step is necessary to make them equal. If M<N, then the UE ID is padded with either leading zeros or trailing zeros to be equal in length to the CRC. This "padded UE ID" is N modulo 2 added to the CRC 106. If M>N, then the least significant M-N bits are truncated from the UE ID. The truncated UE ID is then modulo 2 added to the CRC.

Figure 4B:
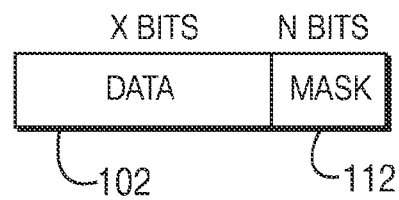
FIG. 4B is a data burst transmitted by the system of FIG. 4A including a data field and a mask field.

Referring to FIG. 4B, the mask 112 that is generated is appended to the data field 102 for transmission.

Figure 5A:
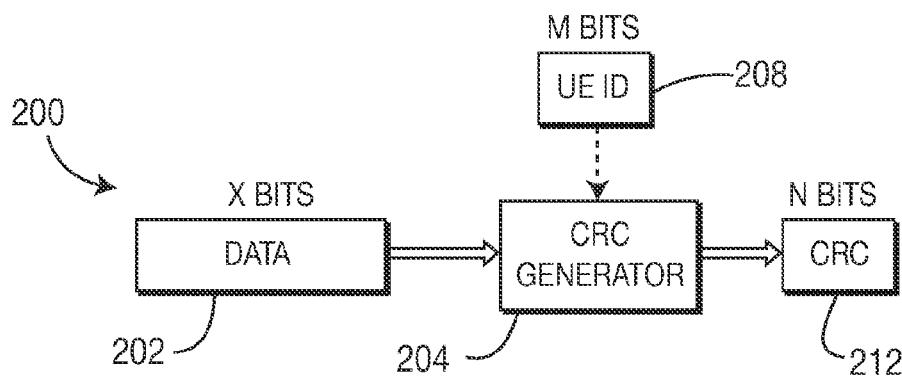
FIG. 5A is a second embodiment of the present invention including a CRC generator which is initialized using the UE ID.

Referring to FIG. 5A, a second embodiment of the present invention is shown. In this embodiment, the system 200 utilizes the data from the data field 202, a CRC generator 204, the UE ID from the UE ID field 208, and the resulting CRC field 212. The system 200 receives the data field 202 and outputs the data from data field 202 into the CRC generator 204. The CRC generator 204 is the same type of generator as the CRC generator 104 from FIG. 4A, except that the CRC generator 204 is initialized with the UE ID from the UE ID field 208. This initialization is illustrated by the dotted line in FIG. 5A. As is well known by those of skill in the art, a CRC generator is typically initialized to all zeros, as was the case with the CRC generator 104 shown in FIG. 4A. Accordingly, the CRC generator 204 generates a CRC based upon the input data from the data field 202 and the initialization of the CRC generator 204 with UE ID. No modulo 2 addition is required in this embodiment.

Preferably, the number of bits of the UE ID from the UE ID field 208 (M bits) is the same as the size of the CRC generator 204, although this is not necessary. If the size of the UE ID (M-bits) is less than the size of the CRC generator 204, then the UE ID may be padded with either leading zeros or trailing zeros to be equal in length to the size of the CRC generator 204. This "padded UE ID" may then be used to initialize the CRC generator 204. Alternatively, the value in the UE ID field 208 may be loaded to initialize the CRC generator 204, and any bit positions not filled by the UE ID would be zero. If the size of the UE ID (M bits) is greater than the size of the CRC generator 204, then the least significant bits are truncated from the UE ID in order to fit the UE ID to CRC generator 204. The truncated UE ID is then used to initialize the CRC generator 204.

Figure 5B:
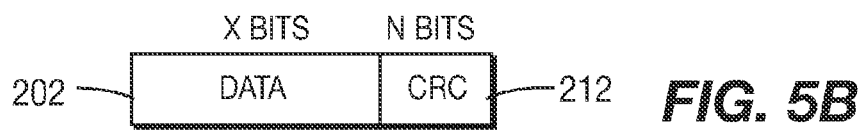
FIG. 5B is a data burst transmitted by the embodiment of FIG. 5A including a data field and a CRC field.

Referring to FIG. 5B, the CRC field 212 that is generated is appended to the data field 202 for transmission.

This second embodiment of the present invention utilizing implicit UE ID presents a simplistic, yet robust, alternative since it does not require assembly and disassembly of the UE ID with the SCCH-HS, at the transmitter or the receiver, as required by UE-specific CRC methods of the prior art and the first embodiment.

Referring to FIG. 7A, a fifth embodiment of the present invention is shown. In this embodiment, the system 400 utilizes the data from the data field 402, the UE ID from the UE ID field 408A, a modulo 2 adder 410, a mask 411, a CRC generator 404 and the resulting CRC field 412. The system 400 receives the data field 402 and inputs the data from the data field 402 into a first input of the modulo 2 adder 410. The UE ID from UE ID field 408A is output to the second input to the modulo 2 adder 410. The data from the data field 402 and the UE ID from the UE ID field 408A are modulo 2 added to create a mask 411. The mask 411 is input into the CRC generator 404, which generates the CRC field 412.

In this embodiment, the number of bits of the UE ID field 408A (M bits) must be the same as the number of bits of the data field 402 in order to perform the modulo 2 addition. If the M is equal to X, then the UE ID from the UE ID field 408A may be directly modulo 2 added to the data from the data field 402. Due to the length of the data field 402, it is not expected that M will be greater than X. However, if this were to occur, then the least significant bits are truncated from the UE ID field 408A until the length of the UE ID field is equal to X. The truncated UE ID is then modulo 2 added to the value from the data field 402.

Due to the length X of the data field 302, it is not expected that M will be greater than X. However, if this were to occur, then the least significant M-X bits are truncated from the value in UE ID field 308A. The truncated UE ID is then modulo 2 added to the data from the data field 302.

Figure 6A:
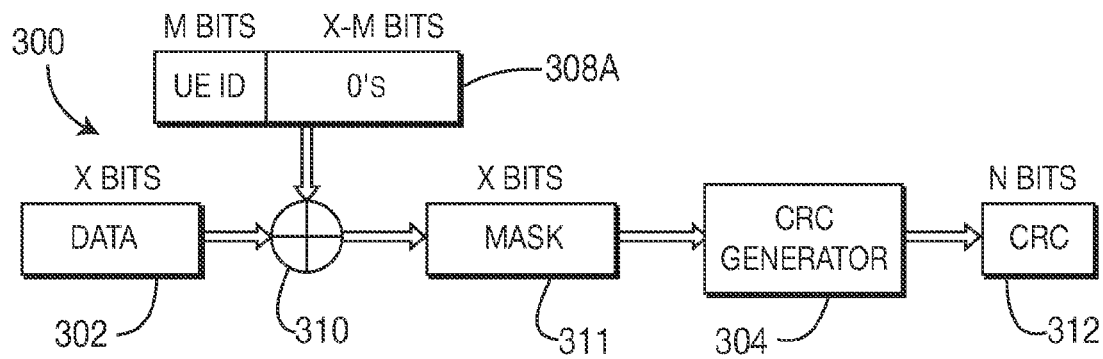
FIG. 6A is a third embodiment of the present invention which modulo 2 adds the data field to a UE ID field padded with trailing zeros to create a mask.
Figure 6B:
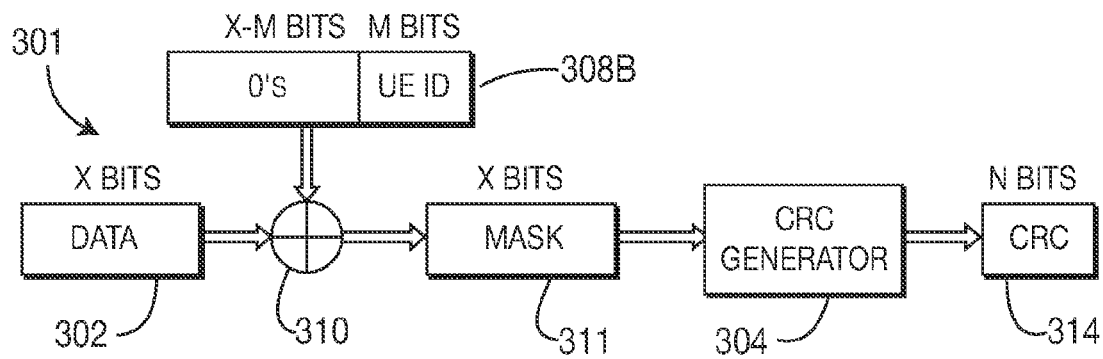
FIG. 6B is a fourth embodiment of the present invention which modulo 2 adds the data field to a UE ID field padded with leading zeros to create a mask.

Referring to FIG. 6B, a fourth embodiment of the present invention is shown. In this embodiment, the system 301 operates in the exact same manner as the third embodiment shown in FIG. 6A. The only difference in this embodiment is the method in which the value from the UE ID field 308B is generated. In this embodiment, the UE ID is padded with X-M leading zeros such that the UE ID from the UE ID field 308B is equal in length to the data field 302. This "padded UE ID value", as shown in FIG. 6B, is then modulo 2 added to the data from the data field 302. It should be noted that the padding may alternatively comprise a combination of leading and trailing zeros (not shown) in order to make the UE ID the same length as the data field.

Figure 6C:
FIG. 6C is the data burst transmitted by the embodiments of FIG. 6A and 6B including a data field and a CRC field.

Referring to FIG. 6C, the CRC field 312 that is generated from the system 300 of the third embodiment shown in FIG. 6A, or the CRC 314 that is generated from the system 301 of the fourth embodiment shown in FIG. 6B, is appended to the data field 302 for transmission. Accordingly, either type of CRC field 312, 314 may be used and appended onto the data field 302.

Referring to FIG. 7A, a fifth embodiment of the present invention is shown. In this embodiment, the system 400 utilizes the data from the data field 402, the UE ID from the UE ID field 408A, a modulo 2 adder 410, a mask 411, a CRC generator 404 and the resulting CRC field 412. The system 400 receives the data field 402 and inputs the data from the data field 302 into a first input of the modulo 2 adder 410. The UE ID from UE ID field 408A is output to the second input to the modulo 2 adder 410. The data from the data field 402 and the UE ID from the UE ID field 408A are modulo 2 added to create a mask 411. The mask 411 is input into the CRC generator 404, which generates the CRC field 412.

In this embodiment, the number of bits of the UE ID field 408A (M bits) must be the same as the number of bits of the data field 402 in order to perform the modulo 2 addition. If the M is equal to X, then the UE ID from the UE ID field 408A may be directly modulo 2 added to the data from the data field 402. Due to the length of the data field 302, it is not expected that M will be greater than X. However, if this were to occur, then the least significant bits are truncated from the UE ID field 408A until the length of the UE ID field is equal to X. The truncated UE ID is then modulo 2 added to the value from the data field 402.

If the length of the UE ID is shorter than the data field 402, then a "composite UE ID" is created such that the value from the UE ID field 408A is equal to X. The composite UE ID is created by repeating the UE ID as many times as it will fit within an X-bit field, then filling in the remaining trailing bits with a truncated UE ID. This is represented in the UE ID field 408A in FIG. 7A. The composite UE ID is then modulo 2 added to the data from the data field 402.

Referring to FIG. 7B, a sixth embodiment of the present invention is shown. The system 401 of this embodiment operates in the same manner as the fifth embodiment shown in FIG. 7A. The only difference in this embodiment is the value from the UE ID field 408B. Although the composite UE ID created in the same manner as in FIG. 7A, the truncated UE ID portion is added as leading bits, as opposed to the trailing bits in the UE ID field 408A shown in FIG. 7A. It should be noted that the truncated UE ID "padding" may include a combination of leading and trailing truncated bits in order to make the UE ID the same length as the data field 402.

Referring to FIG. 7C, the CRC field 412 that is generated from either the system 400 of the fifth embodiment shown in FIG. 7A, or the CRC field 414 that is generated from the system 401 of the sixth embodiment shown in FIG. 7B, is appended to the data field 402 for transmission. Accordingly, either type of CRC field 412, 414 may be used and appended onto the data field 402.

It should be noted that all of the above-described embodiments can be used to support multiple identities (IDs). A UE may be required to process messages addressed at several levels: 1) the UE's unique ID, 2) an ID corresponding to a subset or group of UEs, where the UE belongs to the subset; or 3) a broadcast (global ID) corresponding to all UEs in the system. For example, as shown in FIG. 8, UE ID 12 has been highlighted to indicate that it will able to receive and process IDs at four different levels: 1) the UE-specific ID (#12); 2) subsubset C ID; 3) subset 2 ID; and 4) global ID. It should also be noted that alternate group identifications A-E, may also be created such that a different group of UEs may be included. For example, group B will include all of the UEs identified next to group B which include UE numbers 2, 7, 12, 17, 22 and 27. Additionally, any group or subgroup may be created by specifically identifying individual UEs as desired by a user.

To support this requirement, the transmitter generates the CRC as described above with each of the embodiments. At the receiver, the UE processes the message and generates the expected CRC, without the ID-based modification. The UE processor then modulo 2 adds the received CRC to the calculated CRC. The resultant output is the transmitted ID, which can be any one of the IDs described above. If the ID is none of these, then the UE discards the transmission.

In accordance with the present invention, using the CRC code of the length N, the undetected error probability on the identified SCCH-HS approaches $2^{-n}$. Using a 24-bit CRC to protect data transmitted on HS-DSCH, a 16-bit CRC to protect control information transmitted on SCCH-HS, and assuming $10^{-3}$ false acceptance probability for HI bits by an unintended UE, the embodiments in accordance with the present invention hereinbefore described will provide the probability of the false acceptances as follows:

$$P_{fa}=P_{fa}HI \times P_{fa}H \times P_{SD} \qquad \text{Equation (1)}$$

where $P_{fa}$ is the probability of a false acceptance; $P_{fa}HI$ is the probability of a false acceptance of HI; $P_{fa}H$ is the probability of a false acceptance of SCCH-HS; and $P_{SD}$ is the probability of a successful detection of HS-DSCH ($P_{SD}$).

Using the above identified values for the present example with Equation (1):

$$P_{fa}=10^{-3} \times 2^{-16} \times 2^{-24}=9.1 \times 10^{-16}$$

The reliability computation indicates that for the same length CRC, the probability of a user passing erroneous data up to a higher layer, will be extremely low.

Referring to FIG. 9, the flow diagram illustrates a method for processing downlink messages between a node B and a UE in accordance with the present invention. This method provides a general overview and should not be interpreted as a comprehensive description of all of the detailed medium access control (MAC) layer and physical layer signaling required for processing a message, (i.e., a data packet). The node B first generates a downlink control message in the MAC layer (step 1) and then forwards the message and the UE ID to the physical layer (step 2). The physical layer generates the CRC and applies the UE ID for forwarding with the message (step 3) as a data burst. The message is then transmitted from the node B to the UE (step 4). At the physical layer, the UE ID and the CRC are checked to determine if they are correct (step 5). If so, the message is forwarded to the MAC layer (step 6) which then further processes the message (step 7).

It should be noted that step 6 in FIG. 9 includes an additional signal between the physical layer and the MAC layer, which comprises a control message that indicates the CRC/UE ID is valid. However, this is an optional step. In the preferred embodiment, only valid messages will be forwarded from the physical layer to the MAC layer. Accordingly, in the preferred embodiment, the MAC layer will assume that any message that is forwarded to the MAC is valid. In the alternative embodiment, the additional CRC/UE ID valid signaling will be forwarded along with the message as an additional confirmation.

The present invention has the advantage of eliminating separate processing steps for the UE ID and the CRC. When the two fields are combined as hereinbefore described, the UE will not further process any message until both the CRC and the UE ID (or other type of ID shown in FIG. 8) are correct.

While the present invention has been described in terms of the preferred embodiment, other variations, which are within the scope of the invention, as outlined in the claims below will be apparent to those skilled in the art.

What is claimed is:

1. A user equipment (UE) comprising:
    circuitry configured to receive a wireless signal of a control channel, wherein the wireless signal comprises an N bit field and control information, and the N bit field comprises an N bit cyclic redundancy check (CRC) modulo two added to an N bit UE identity, wherein the value of N is a positive integer;
    circuitry configured to determine whether criteria are met, wherein the criteria include the CRC is correct and the UE identity is any one of a plurality of UE identities associated with the UE; and
    circuitry configured to use the control information to process a downlink shared channel on a condition that the criteria are met.

2. The UE of claim 1 further comprising circuitry configured to monitor a plurality of control channels.

3. The UE of claim 1 wherein at least one of the plurality of UE identities associated with the UE is unique to the UE.

4. The UE of claim 1 wherein at least one of the plurality of UE identities associated with the UE is an identity assigned to the UE.

5. The UE of claim 4 wherein the identity assigned to the UE is unique within a subset of UEs operating in a wireless network.

6. The UE of claim 1 wherein at least one of the plurality of UE identities associated with the UE identifies a group of UEs belonging to a plurality of subsets of UEs operating in a wireless network.

7. The UE of claim 1 wherein at least one of the plurality of UE identities associated with the UE is a global identity which is the same for each UE operating in a wireless network.

8. The UE of claim 7 wherein the UE receives a broadcast message associated with the global identity on the downlink shared channel.

9. The UE of claim 1 wherein at least one of the plurality of UE identities associated with the UE is further associated with a group of UEs operating in a wireless network.

10. The UE of claim 9 wherein the at least one of the plurality of UE identities associated with the UE is a global identity which is the same for each UE operating in the wireless network.

11. A method implemented in a user equipment (UE) device comprising:
    the UE device receiving a wireless signal of a control channel, wherein the wireless signal comprises an N bit field and control information, and the N bit field comprises an N bit cyclic redundancy check (CRC) modulo two added to an N bit UE identity, wherein the value of N is a positive integer;
    the UE device determining whether criteria are met, wherein the criteria includes the CRC is correct and the UE identity is any one of a plurality of UE identities associated with the UE device; and
    the UE device using the control information to process a downlink shared channel on a condition that the criteria are met.

12. The method of claim 11 further comprising the UE device monitoring a plurality of control channels.

13. The method of claim 11 wherein at least one of the plurality of UE identities associated with the UE device is unique to the UE.

14. The method of claim 11 wherein at least one of the plurality of UE identities associated with the UE device is an identity assigned to the UE.

15. The method of claim 14 wherein the identity assigned to the UE device is unique within a subset of UE devices operating in a wireless network.

16. The method of claim 11 wherein at least one of the plurality of UE identities associated with the UE device identifies a group of UE devices belonging to a plurality of subsets of UE devices operating in a wireless network.

17. The method of claim 11 wherein at least one of the plurality of UE identities associated with the UE device is a global identity which is the same for each UE device operating in a wireless network.

18. The method of claim 17 wherein the UE device receives a broadcast message associated with the global identity on the downlink shared channel.

19. The method of claim 11 wherein at least one of the plurality of UE identities associated with the UE device is further associated with a group of UE devices operating in a wireless network.

20. The method of claim 19 wherein the at least one of the plurality of UE identities associated with the UE device is a global identity which is the same for each UE device operating in a wireless network.

* * * * *